United States Patent [19]

Shephard, III et al.

[11] Patent Number: 5,633,877
[45] Date of Patent: May 27, 1997

[54] PROGRAMMABLE BUILT-IN SELF TEST METHOD AND CONTROLLER FOR ARRAYS

[75] Inventors: Philip G. Shephard, III, Round Rock, Tex.; William V. Huott, Holmes; Paul R. Turgeon, Woodstock, both of N.Y.; Robert W. Berry, Jr., Round Rock, Tex.; Gulsun Yasar, South Burlington, Vt.; Frederick J. Cox, Kirkland, Wash.; Pradip Patel, Poughkeepsie; Joseph B. Hanley, III, Patterson, both of N.Y.

[73] Assignee: International Business Machines Corporation, Armonk, N.Y.

[21] Appl. No.: 450,585

[22] Filed: May 31, 1995

[51] Int. Cl.[6] .................................................. G06F 11/00
[52] U.S. Cl. ............................... 371/22.2; 371/22.5
[58] Field of Search .................. 371/22.2, 22.5, 371/22.4, 22.6, 25.1, 27

[56] References Cited

U.S. PATENT DOCUMENTS 4,740,970  4/1988  Burrows et al. .
5,173,906  12/1992  Dreibelbis et al. .

Primary Examiner—Vincent P. Canney
Attorney, Agent, or Firm—Lynn L. Augspurger; Laurence J. Marhoefer

[57] ABSTRACT

An array built-in self test system has a scannable memory elements and a controller which, in combination, allow self test functions (e.g. test patterns, read/write access, and test sequences) to be modified without hardware changes to the test logic. Test sequence is controlled by logical test vectors, which can be changed, making the task of developing complex testing sequences relatively easy.

18 Claims, 3 Drawing Sheets

PROGRAMMABLE BUILT-IN SELF TEST METHOD AND CONTROLLER FOR ARRAYS

BACKGROUND OF THE INVENTION

1. Field of the Invention

This invention relates to an improved built-in system for testing integrated circuits, and more particularly to a built-in array test system that is programmable.

2. Description of the Prior Art

In general, integrated circuit arrays are tested by providing a known data input at a known address to the array and comparing the output to the expected output. One well-known and widely used prior art system for testing integrated circuit logic, particularly integrated circuit memory arrays, is to form a dedicated test circuit on the chip with the array itself. This so-called Array Built-In Self Test (ABIST) technology allows high speed testing of the array without having to force correspondence between the array and the input/output connections to the chip itself. In order to provide high speed testing and to confine the test system to a minimum area of the chip, prior art ABIST systems (test patterns, control sequences, test data gathering) are hard-wired systems specifically designed to test for particular types of errors predicted to occur in the array. This necessitates chip logic changes if/when new self test functions or features become required (as, for example, in the case that a previously unexpected failure mechanism must now be tested for). Also, test patterns have generally been limited to a well-known set including all 0's, all 1's, checkerboard, checkerboard complement, and pseudo-random. These prior art systems permit very limited looping and "address hold" test capabilities, and addressing controls typically allow only one type of change (increment or decrement, for example) per test sequence.

U.S. Pat. No. 5,173,906 to Dreibelbis et al, issued Dec. 22, 1992, provides a BIST (Built-In Self Test) function for VLSI logic or memory module which is programmable. This circuitry is provided with a looping capability to enable enhanced burn-in testing. An on-chip test arrangement for VLSI circuits is provided with programmable data pattern sequences wherein the data patterns are selectable via instruction code in order to reduce the probability of self test redesign. However, this Dreibelbis patent does not provide flexibility to test VLSI circuits with any and all tests which can be required to test both static and dynamic arrays.

SUMMARY OF THE INVENTION

An object of this invention is the provision of a programmable ABIST system for testing arrays, particularly arrays embedded within dense VLSI logic chips; a system that can generate new test patterns and new test sequences without requiring hardware changes to the controller or to the test system.

Another object of the invention is the provision of a programmable ABIST test system with hardware requirements and speed of test execution comparable or better than hardwired, prior art ABIST systems.

Briefly, this invention contemplates the provision of an array built-in self test system which allows self test functions (e.g. test patterns, read/write access, and test sequences) to be modified without hardware changes to the test logic. In one embodiment, test sequence is controlled by scanned logical test vectors (instructions), which can be changed, making the task of developing complex testing sequences relatively easy.

This embodiment of the system is implemented as a VLSI integrated circuit, with scannable, programmable memory elements for use in generating test data patterns and test operational sequences, including:

- a read/write register coupled to an accompanying state machine,
- a data input register coupled to an accompanying state machine,
- a data output register with data compression capability or failing address capture capability, coupled to an accompanying state machine,
- an array address control register with accompanying state machine,
- a microcode pointer control register with accompanying state machine, and
- a microcode array which provides a program sequence means for accomplishing testing of the array by manipulating the various state machines.

Test data patterns may be scanned (using predetermined test patterns) or may be pseudo-randomly generated. Test functions include, but are not limited to, the following examples. Test data patterns may be held constant for the duration of a particular test sequence, circulated in a loop (marching a 0 through all bit positions against an all 1's background, for example), circulated in a loop using an external carry bit (this allows for further modification of the test pattern), inverted as it circulates in a loop, and complemented within the data in register.

Array address controls allow stepping addresses in ascending or descending order, along bit-line or word-line addressing order. Array addresses may also be held constant for repeated, consecutive accesses of the same address. The array address controls also enable stepping along bit-line and word-line addresses within a given test sequence.

Array write controls allow any combination of read/write sequences, limited only by the size of the microcode array. For example, the read/write controls may allow write-then-read and read-then-write test sequences on an address under test, multiple writes-then-read to an address under test, multiple reads-after-write to an address under test, and programmable combinations of read/write operations to particular addresses or address ranges.

The array address and test data controls also allow for branching within the test sequence, including simple "back to the origin" branches, or branches to an address, as well as branches on condition.

The test data patterns, array address controls, and array write controls are initialized via scanning. The microcode pointer control register thereby controls the various test state machines via the logical test vectors to enable "at speed" functional testing of the array. Test results are gathered via scanning. Subsequent test scenarios are also scanned in. Failures can also be monitored on the fly in certain cases.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
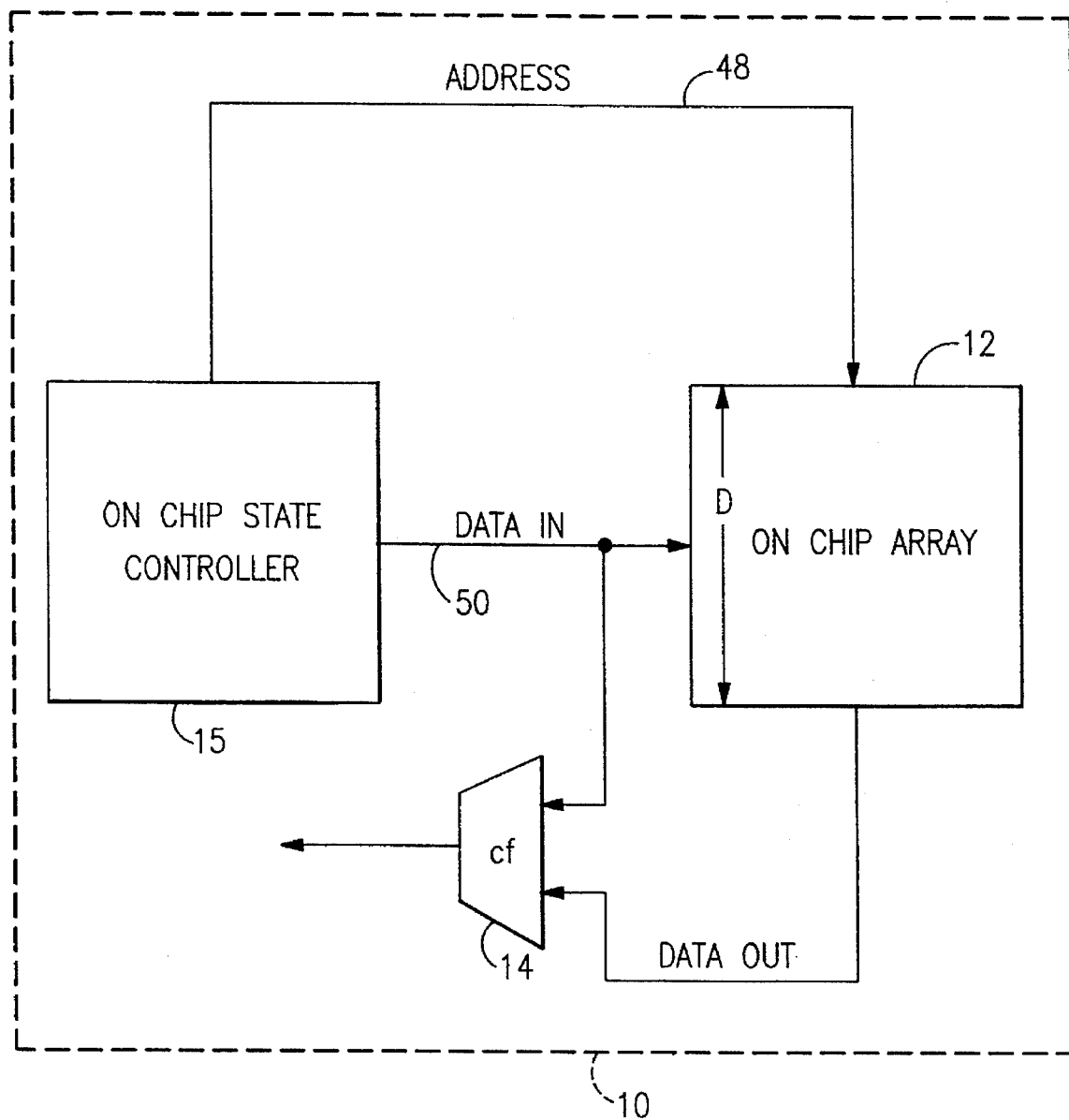
FIG. 1 is a general block diagram showing a portion of an integrated circuit chip with a memory array and an array built-in self test system both formed in the chip.

Referring now to FIG. 1 of the drawings, a region 10 of an integrated circuit chip has formed therein a memory array 12, which is D bits wide. Also formed in the region 10, in close proximity to the array 12, is an array built-in self test system, which includes a programmable state controller 15. The programmable state controller 15 generates a sequence of data pattern inputs and address inputs to the array 12. The data pattern is read into the array 12 and then read out. Logic 14 compares the data output of the array with the expected data output pattern (i.e. the input data pattern) and provides, for example, a compressed pass/fail output indication as in FIG. 2 or, in the preferred embodiment of the invention shown in FIG. 3, a failed address function that identifies the address at which an error occurred.

Figure 2:
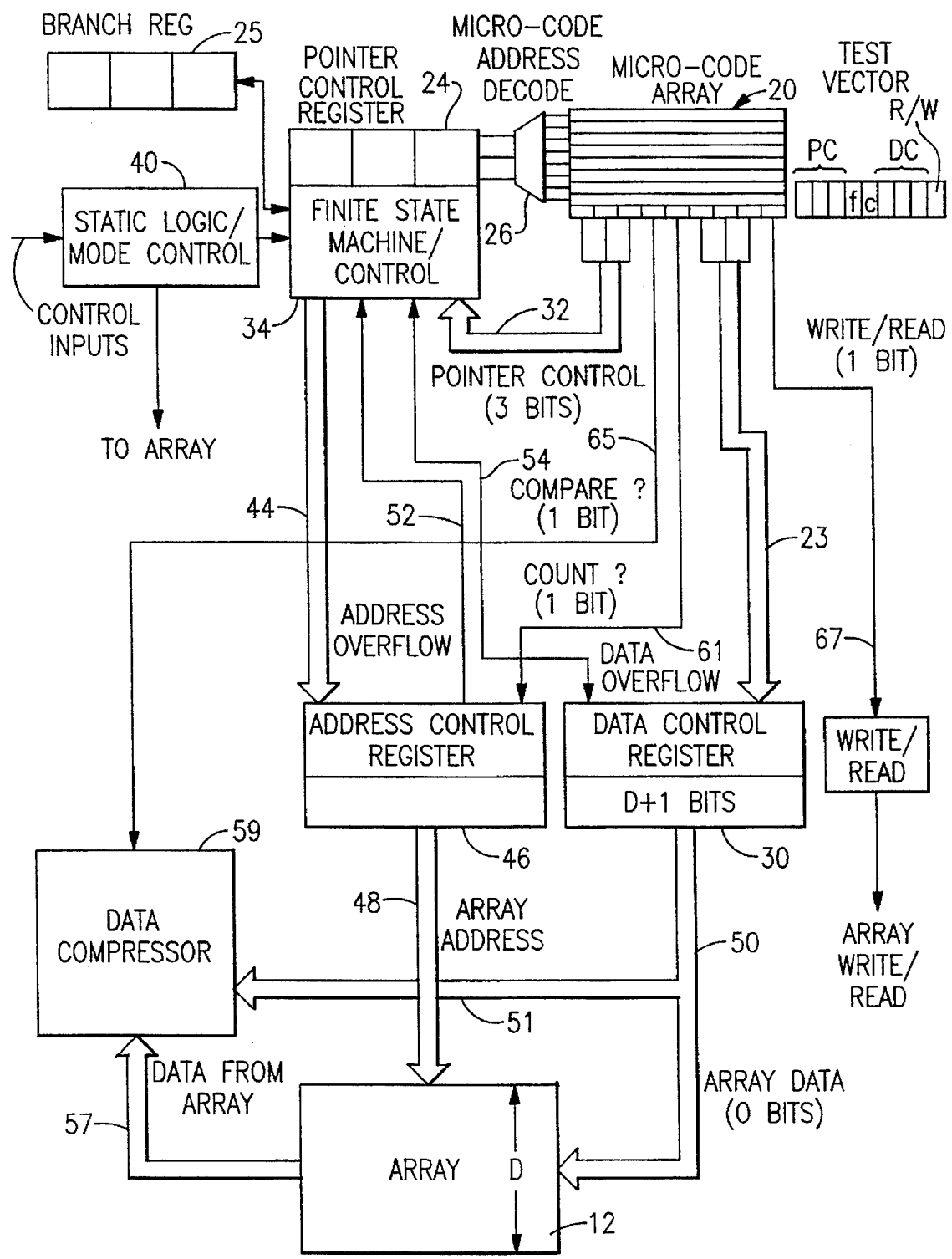
FIG. 2 is a block diagram showing a specific embodiment of an array built-in self test system in accordance with the teachings of this invention.

Referring now to FIG. 2 of the drawings, in this exemplary embodiment of the invention, an array 20 of memory elements, for example, eight, nine-bit instruction registers, in combination with a microcode pointer control register 24, functions as programmable state sequencer. A microcode address decoder 26 couples the microcode pointer control register 24 to the scannable array 20. During each cycle, one instruction register is selected by the pointer and the contents of the register is read out and used to determine the action to be taken. Two actions are possible in this specific exemplary embodiment; (a) send signals to other test control elements, and (b) alter the pointer register 24 (i.e. increment the pointer, decrement the pointer, hold current pointer value, reset the pointer to zero, or change pointer to value contained in branch register).

Each instruction vector in the array 20 has five fields; a three bit pointer control field PC, a one bit failed address function control field f; a one bit address count control field c; a three bit data control field DC, and a one bit read/write control field r/w.

A bus 23 couples the three bit data control field from a register selected by the pointer 24 to a data control register 30 of the array. The data control register is D+1 bits wide, where D is equal to the width of the array 12. In this embodiment of the invention, there are eight possible operations that can be performed on the data in register 30. These operations are:

rotate data by D bits;
rotate data by D bits with invert;
rotate data by D+1 bits;
rotate data by D+1 bits with invert;
hold data;
invert data;
reset data; and
checkerboard data.

A bus 32 couples the three bit pointer control field from array 20 to finite state control logic 34, which loads the microcode pointer control register 24 with an address specified by the pointer control field. Alternatively, the state control logic 34 loads the contents of a branch register 25 into the microcode pointer control register when the pointer control field specified a branch on register operation. There are eight possible operations that can be performed on the contents of the microcode pointer control register 24. These operations are:

branch to branch register 25;
increment (unconditional);
increment on Address Overflow else hold;
increment on Address Overflow else go to 0;
increment on Data Overflow else hold;
increment on Data Overflow else go to 0;
increment on Address Overflow else −1; and
increment on Data Overflow else −1.

A static logic/mode control 40, coupled to the state control logic 34, is used to enable or disable the programmable ABIST in response to an external control input 42.

A bus 44 couples the address sequencing instruction from the state control logic 34 to an address control register 46 of the array. There are four possible address mode sequences. These are:

increment by Bit Address;
decrement by Bit Address;
increment by Word Address; and
decrement by Word Address.

Busses 48 and 50 respectively couple the outputs of the address control register 46 and the data control register 30 to the array 12. Busses 52 and 54 respectively couple the address overflow state of the address control register 46 and the data overflow state of the data control register 30 to the state control logic 34. A bus 51 couples data read into array 12 to a suitable data compressor 59 known in the prior art where it is compared with data on bus 57 read from array 12. In one embodiment of this invention, a data out register and a function generator can be specifically added to perform a multiple input signature register (MISR) function. In another embodiment, existing array registers can be used to implement the MISR function.

A bus 61 couples the one bit address count control field c from the microcode array 20 to the address control register 46 in order to enable or inhibit the change of address in accordance with the state of address count control field. A bus 65 couples the one bit failed address function control signal to enable or disable the failed address function logic 56.

Conductors 52 and 54 couple respectively the overflow status of the address control register 46 and an overflow status of the data control register 30 to the state control logic 34. A conductor 67 couples the one bit read/write control field of the millicode array vector to a read/write control 68 of the array 12.

In this specific embodiment of the invention, the data control operators are:

000 Rotate data by D bits
001 Rotate data by D bits with invert
010 Rotate data by D+1 bits
011 Rotate data by D+1 bits with invert
100 Hold data
101 Invert data
110 Reset data
111 Checkerboard data The pointer sequence control operators are:

000 Branch to branch reg
001 Increment (Unconditional)
010 Increment on Address Overflow else hold
011 Increment on Address Overflow else go to 0
100 Increment on Data Overflow else hold
101 Increment on Data Overflow else go to 0

Figure 3:
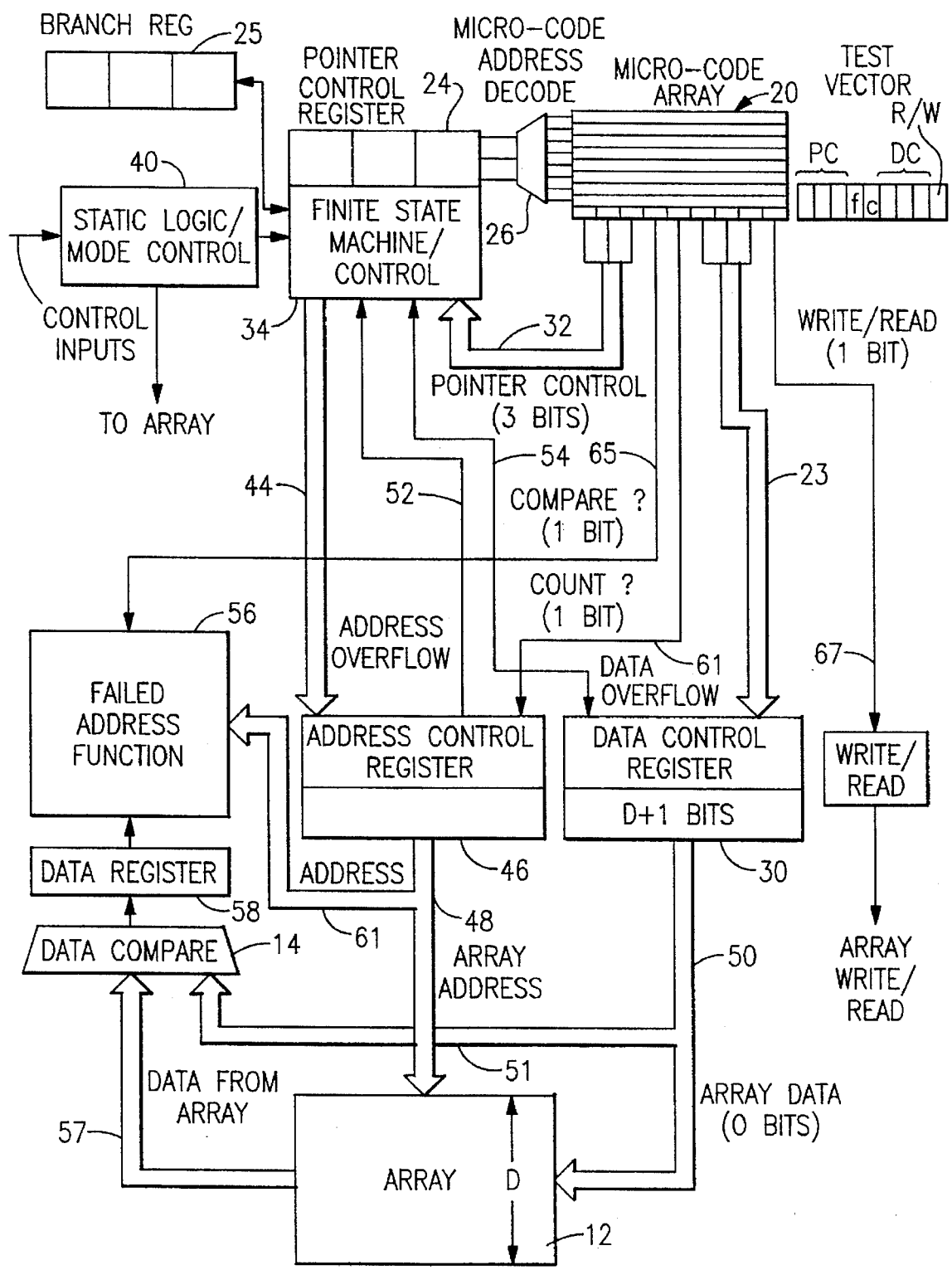
FIG. 3 is a block diagram similar to FIG. 2 showing an implementation of the invention with a failed address capture function

110 Increment on Address Overflow else −1
110 Increment on Data Overflow else −1
The address control operators are:
00 Increment by Bit Address
01 Decrement by Bit Address
10 Increment by Word Address
11 Decrement by Word Address In operation, microcode array 20 and the microcode pointer control register 24 together act as a programmable state sequencer. During each cycle, one instruction register is selected by the pointer and is used to determine what action is to be taken. In addition, the data overflow and address overflow state is coupled to the state control logic in order, in some cases, to update the pointer. The control logic 34 looks at the overflow bit and can "branch" in the test sequence based on its value. The mode control address function allows addresses to be changed sequentially, either along the bit lines or word lines, either increasing or decreasing. The read/write register determines whether a read or a write operation is to be performed in this test cycle. The state control logic can branch in response to an address overflow state and the address can be held in the address register unchanged in response to the count bit in order to apply multiple write and/or read array signals for stressing the array address. Referring now to FIG. 3, this embodiment of the invention includes failed address function logic 56 and data output register 58 which are used to identify a specific address at which an error occurred. In the event data comparator 14 detects a data error the failed data pattern or a portion of the failed data pattern is coupled to the data output register 58. Bus 61 couples the address of the failed data output to the failed address function logic 56, which identifies the address of the failed data output.

If test hardware overhead must be kept to an absolute minimum, the microcode pointer control register and microcode array register may be replaced by a static control register which adds a very small amount of logic to perform many of the basic test operations herein described. An additional mode of operation is added to the address register so it can be configured in two lengths (the original M bits, or M+1). The write/read (W/R) control register can be configured into selectable odd and even length recirculating scan registers or as the most significant bit of the address register.

Mode select SRLs are used to select the mode of operation of the previously defined building blocks. Conditional control SRLs are used to select when these building blocks change states.

The conditional control of this example includes the following:
W/R control register conditional control:
  step on M address carry out
  step on M+1 address carry out
  unconditional step
Address counter conditional control:
  step on write/read control
  step on data N or N+1 (with polarity control)
  unconditional step
WR-Data register conditional control
  step on w/r carry out (with polarity control)
  step on address carry out (with polarity control)
  step on address and W/R carry out
  unconditional step While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A built-in, on-chip test system for testing an array having data input ports, data output ports, and address ports, comprising in combination:

a data control register for generating and applying deterministic data patterns to the data input ports of said VLSI array;

an address control register for generating addresses for application to said array chip in coordination with said data control register;

a comparator for comparison of data inputted to said data input ports of said VLSI array from said data control register with data outputted from said data output ports of said VLSI array;

a memory array for storing a plurality of microcode control vectors, each vector including a data control register field, an address control register field, the microcode pointer control register field and a read/write enable control field;

a microcode pointer control register and finite state machine for means controlling said address control register, said data control register and said microcode pointer control register in response to said plurality of microcode control vectors and to an overflow feedback state of said data control register and said address control register.

2. A built-in, on-chip, test system according to claim 1, wherein said comparator includes failing address function means for retaining failing addresses.

3. A built-in, on-chip, test system according to claim 1, wherein said data control register generates and modifies data patterns by rotation of data scanned into the register.

4. A built-in, on-chip, test system according to claim 1, wherein said data control register generates and modifies data patterns by rotation and inversion of data scanned into the register.

5. A built-in, on-chip, test system according to claim 1, wherein said data control register generates and modifies data patterns by rotation, bit addition, and inversion of data scanned into the register.

6. A built-in, on-chip, test system according to claim 1, wherein said data control register generates and modifies data patterns by rotation and one-bit addition of data scanned into the register.

7. A built-in, on-chip, test system according to claim 1, wherein said data control register generates and modifies data patterns by rotation of data scanned into the register.

8. A built-in, on-chip, test system according to claim 1, wherein said data control register generates and modifies data patterns by holding data scanned into the register.

9. A built-in, on-chip, test system according to claim 1, wherein said data control register generates and modifies data patterns by resetting data scanned into the register.

10. A built-in, on-chip, test system according to claim 1, wherein said data control register generates and modifies data patterns by checkerboarding data scanned into the register.

11. A built-in, on-chip test system according to claim 1, wherein said data output means collects and compresses data from said output ports and compares the results against expected results.

12. A built-in, on-chip, test system according to claim 1, wherein a test sequence for testing said embedded array includes data as to which addresses to test, which data pattern to use, and whether and when to read or write, and said test sequence is modifiable by execution of a conditional branch of said sequence which is determined by an overflow state of the address control register and/or the data control register.

13. A built-in, on-chip, test system according to claim 12, wherein said test sequence branches to an address in a branch control register.

14. A built-in, on-chip, test system according to claim 1, including a vector field to hold an array address constant in order to apply multiple write and/or read array signals for stressing said address.

15. A built-in, on-chip, test system according to claim 11, further including a vector field to hold an array address constant in order to apply multiple write and/or read array signals for stressing said address.

16. A built-in, on-chip, test system according to claim 1, wherein said array is a stand-alone array chip.

17. A built-in, on-chip, test system according to claim 1, wherein said array is embedded within a VLSI logic chip.

18. A built-in, on-chip, test system according to claim 1, wherein the microcode pointer control register and microcode array functions are performed by a static control register.

* * * * *